(12) United States Patent
Ewert et al.

(10) Patent No.: US 12,291,123 B2
(45) Date of Patent: May 6, 2025

(54) ELECTRONIC CIRCUIT ARRANGEMENT AND METHOD

(71) Applicant: Mahle International GmbH, Stuttgart (DE)

(72) Inventors: Sebastian Ewert, Stuttgart (DE); Max Gerstadt, Stuttgart (DE); Michael B. Wagner, Rottweil (DE)

(73) Assignee: Mahle International GmbH (DE)

( * ) Notice: Subject to any disclaimer, the term of this patent is extended or adjusted under 35 U.S.C. 154(b) by 615 days.

(21) Appl. No.: 17/591,552

(22) Filed: Feb. 2, 2022

(65) Prior Publication Data

US 2022/0242268 A1 Aug. 4, 2022

(30) Foreign Application Priority Data

Feb. 2, 2021 (DE) .......................... 102021200913.1

(51) Int. Cl.
*H02J 7/00* (2006.01)
*B60L 53/18* (2019.01)
*B60L 53/30* (2019.01)
*B60L 53/60* (2019.01)
*B60L 53/66* (2019.01)
*H03H 7/06* (2006.01)

(52) U.S. Cl.
CPC .............. *B60L 53/66* (2019.02); *B60L 53/18* (2019.02); *B60L 53/30* (2019.02); *B60L 53/305* (2019.02); *B60L 53/60* (2019.02); *H03H 7/06* (2013.01)

(58) Field of Classification Search
CPC .......... B60L 53/18; B60L 53/30; B60L 53/60; B60L 53/66; B60L 53/305; H03H 7/06

USPC ............................................ 320/109; 701/22
See application file for complete search history.

(56) References Cited

U.S. PATENT DOCUMENTS

2010/0213896 A1\* 8/2010 Ishii ...................... B60L 3/0084
320/109
2013/0154667 A1 6/2013 Scheu
(Continued)

FOREIGN PATENT DOCUMENTS

| DE | 102019113083 A1 | 6/2020 |
|---|---|---|
| EP | 2197084 A1 | 6/2010 |
| EP | 3 696 010 A1 | 8/2020 |

OTHER PUBLICATIONS

European Search Report dated Jun. 29, 2022 for European Patent Application No. 22 154 009.9.
(Continued)

*Primary Examiner* — Zixuan Zhou
(74) *Attorney, Agent, or Firm* — Fishman Stewart PLLC

(57) ABSTRACT

An electronic circuit arrangement for an electric charging station and a method for configuring a an electrical frequency filter device of an electronic circuit arrangement are disclosed. The electronic circuit arrangement includes an electrical pilot contact and an electrical earth contact, to which an electric motor vehicle for forming an electrical communication connection are electrically connectable. An electrical oscillator, for generating a pulse width modulated electrical communication signal, is arranged in an electrical line path and subdivides the line path into a pilot portion ending in the pilot contact and an earth portion ending in an earth contact. A frequency filter device is arranged in the pilot portion of the line path.

20 Claims, 1 Drawing Sheet

(56) References Cited

U.S. PATENT DOCUMENTS

2014/0247893 A1* 9/2014 Komatsu ................ B60L 53/64
　　　　　　　　　　　　　　　　　　　375/258
2018/0334047 A1　11/2018　Wischnack
2020/0180463 A1　　6/2020　Lee

OTHER PUBLICATIONS

English abstract for EP-3 696 010.
German Search report for DE-102021200913.1, dated Sep. 15, 2021.

* cited by examiner

ELECTRONIC CIRCUIT ARRANGEMENT AND METHOD

CROSS-REFERENCE TO RELATED APPLICATION

This application claims priority to German Application No. DE 10 2021 200 913.1 filed on Feb. 2, 2021, the contents of which are hereby incorporated by reference in its entirety.

TECHNICAL FIELD

The invention relates to an electronic circuit arrangement for an electric charging station and to a method for configuring an electrical frequency filter device of such an electronic circuit arrangement.

BACKGROUND

During the conductive charging of electric motor vehicles with electric energy by means of an electric charging station, wherein during such a conductive charging the electric motor vehicle is physically connected electrically to the charging station, an electrical communication connection is usually formed between electric motor vehicle and charging station. The electric motor vehicle and the electric charging station communicate via this electrical communication connection by means of a pulse width modulated electric signal, wherein a positive amplitude of the signal represents the status of the vehicle and the pulse width a specified electric charging current provided by means of the charging station.

A typical standard of the electrical communication connection between the pulse width modulated signal is stated in the standard IEC61851-1. Therein, exact specifications are determined as concerns the tolerance of various parameters of the signal. In terms of the standard, a negative and a positive voltage level as well as certain rise and fall times of the signal or of the pulse of the signal have to be adhered to.

Such a conventional electric charging station is usually electrically connected to the electric motor vehicle to be electrically charged by means of an electrical connection line when the motor vehicle is to be electrically charged. The longer the said connection line is the higher are its resistance value, its electrical capacitance value and its electrical inductance value. With these values, the connection line usually functions as low-pass filter, so that portions of the electrical signal with high frequencies are attenuated to a greater degree. Here, an electrical square wave signal proposed according to the standard IEC61851 contains a wide spectrum of frequencies, which also includes higher-frequency portions, wherein above all these high frequencies of the spectrum are responsible for the edges of the electrical square-wave signal. The steeper the edge, the greater typically the high-frequency portion of the signal has to be.

When the signal is now sent via the connection line, these high frequencies of the spectrum of the square-wave signal are disadvantageously filtered with conventional charging devices, so that the edge steepness decreases over the connection line. Dependent on the length and the composition of the connection line, the edge steepness can decrease so much so that it falls outside the desired range according to the standard. Disadvantageously, this can result in that electric motor vehicles, which strictly adhere to the standard IEC61851, in the state electrically connected to the charging device, are not charged with electric energy in the case that the composition of the connection line lets the signal deviate from the standard.

SUMMARY

It is therefore an object of the present invention to state an electronic circuit arrangement for an electric charging station and to a method for configuring an electrical frequency filter device having such a circuit arrangement, which takes into account the above problem.

This object is solved through the subject of the independent claim(s). Preferred embodiments are subject of the dependent patent claims.

Accordingly, the basic idea of the invention is to equip an electronic circuit arrangement for an electronic charging station, wherein by means of the circuit arrangement an electrical communication connection between the electric charging station and an electric motor vehicle that can be charged with electric energy by means of the charging station can be formed, with a frequency filter device, which attenuates high-frequency portions of an electrical signal transmittable via the communication connection to a lesser degree than low-frequency portions of the signal. Here, the frequency filter device can be configured by means of a method according to the invention, which is based on the general idea of configuring the frequency filter device as a function of the composition of an electrical connection line of the charging station or of the circuit arrangement of the charging station.

Advantageously, the electrical connection line can be counteracted by means of such a frequency filter device or such a configuration of the frequency filter device of the frequency filter effect of the electrical connection line explained above. Thus, adherence to the standard IEC61851 can be better ensured.

An electronic circuit arrangement for an electric charging station according to the invention, wherein by means of the circuit arrangement an electrical communication connection between the electric charging station and an electric motor vehicle that can be charged with electric energy by means of the charging station can be formed, includes an electrical pilot contact and an electrical earth contact. Two pilot contacts can be present, namely a so-called proximity pilot contact and a so-called control pilot contact, wherein the pilot contact within the scope of the present application is to preferentially mean the control pilot contact. For forming the electrical communication connection, the electric motor vehicle can be electrically connected to the pilot contact and to the earth contact. Apart from this, the electronic circuit arrangement includes an electrical line path, in which an electrical oscillator for generating a pulse width modulated electrical communication signal is arranged. The oscillator can be a pulse width modulator functioning as a signal source. Here, the oscillator subdivides the line path, at least in a pilot portion ending in the pilot contact facing away from the oscillator and into an earth portion ending in the earth contact facing away from the oscillator. An electrical parallel line path of the circuit arrangement, in which an electrical capacitance is arranged, is electrically connected to the pilot portion and to the earth portion parallel to the oscillator. The electrical earth portion can be electrically earthed. The electrical capacitance in the parallel line path can be part of a low-pass filter of the electronic circuit arrangement. Here, a, in particular, parametrizable frequency filter device for filtering the electrical communication signal can be arranged in the pilot portion of the electrical line path. In the pilot portion, an electrical voltage measuring device, by means of which an electric voltage applied between pilot and earth contacts can be measured, is electrically connected to the electrical line path between pilot contact and frequency filter device. As already indicated above, the undesirable frequency filter effect of the electrical connection line can be advantageously counteracted by means of the frequency filter device of the electronic circuit arrangement according to the invention, so that adherence of the standardised specifications with respect to the electrical communication connection can be better ensured.

Further, the invention relates to a method for configuring an electrical frequency filter device of the electronic circuit arrangement described above according to the invention. According to the method, the frequency filter device is parametrized as a function of the composition, in particular of the electrical impedance of an electrical connection line defining the pilot portion and the earth portion of the electrical line path at least in portions. Here, the composition of the connection line is determined at least by a selection from a length of the electrical connection line, an electrical resistance value of the connection line, an electrical capacitance value of the connection line and an electrical inductance value of the connection line. Advantageously, the method according to the invention allows exploiting the advantages of the electronic circuit arrangement according to the invention explained above by means of the frequency filter device configured by means of the method to a particularly great extent—namely even in the event that electrical connection lines of different compositions are used on charging stations of the same type.

Practically, when carrying out the method, the composition of the connection line is determined. Thus, the frequency filter device can be particularly precisely matched to the composition of the specifically used connection line.

According to a preferred further development of the method, the connection line defines the pilot portion and the earth portion of the electrical line path in a region that is present outside a housing interior delimited by a housing of the electric charging station. Here, the frequency filter device, the oscillator, the capacitance and a residual region of the electrical line path located away from the connection line are arranged in the housing interior. The region, in which the connection line determines the pilot and the earth portion of the electrical line path can be formed by a cable having two strands for pilot and earth portion electrically insulated from one another. Thus, for configuring the frequency filter device, the composition of such a cable can be taken into account in this further development by means of the method. This proves to be particularly advantageous in particular when—in particular with a view to their length or another composition—different cables are optionally used.

In a further advantageous further development of the method, the frequency filter device comprises an electrical filter resistance value and an electrical filter capacitance value and an electrical filter inductance value, which can each be parametrized as equal to or greater than zero. Thus, the filter resistance value can be parametrized as equal to or great than 0 ohm. The filter capacitance value can be parametrized as equal to or greater than 0 farads. The filter inductance value can be parametrized as equal to or greater than 0 henry. Here, the frequency filter device is parametrized by way of a value table, in which incremental composition values for at least one selection from the length of the electrical connection line, the electrical resistance value of the connection line, the electrical capacitance value of the connection line and the electrical inductance value of the connection line are assigned, in particular cluster-like, to incremental parameter values for the electrical filter resistance value and the electrical filter capacitance value and the electrical filter inductance value. Such a configuration of the frequency filter device can be technically realised particularly easily.

Practically, the pilot and the earth contacts are electrically short-circuited when determining the condition of the connection line. Thus, determining the composition of the connection line both for the pilot and also for the earth portion can take place in one go.

In an advantageous further development of the method, an electrical measuring resistance with predetermined measuring resistance value is electrically connected in series with the pilot portion of the electrical line path. Then, a constant electric voltage of a predetermined voltage value is generated by means of an electric voltage source and applied at a common end of the connection line facing away from the pilot contact and from the earth contact, to the pilot portion and the earth portion. A voltage value of the electric voltage dropping across the measuring resistance is measured. Finally, the composition of the connection line is determined at least by the electrical resistance value of the connection line, which is calculated from the voltage values of the predetermined constant electric voltage and the measured electric voltage dropping across the measuring resistance. Advantageously, the composition of the connection line can thus be determined particularly precisely.

In another preferred further development of the method, a constant electric current of predetermined amperage is generated by means of an electric current source and, at a common end of the connection line facing away from the pilot contact and from the earth contact, applied to the pilot portion and the earth portion. A voltage value of the electric voltage dropping across the pilot portion and the earth portion is measured. Here, the composition of the connection line is determined at least by the electrical resistance value of the connection line which is calculated from the predetermined amperage and the measured voltage value of the electric voltage dropping across the pilot portion and the earth portion. This also allows a particularly precise determining of the composition of the connection line.

According to a further preferred further development of the method, the composition of the connection line is additionally determined at least by the length of the connection line. Here, the length of the connection line is calculated from a predetermined electrical resistance lining of the connection line and the calculated electrical resistance value of the connection line. Thus, the composition of the connection line can be determined even more accurately.

In another advantageous further development of the method, the composition of the connection line is defined at least by the length of the connection line. By means of an electrical voltage impulse source, an electric voltage impulse is generated and, emanating from an end of the connection line facing away from the pilot contact, sent through the region of the pilot portion present in the connection line, wherein the pilot contact is exposed. The voltage impulse is reflected on the pilot contact. Then, the reflected voltage impulse is detected at the end of the connection line facing away from the pilot contact. Here, a transit time between generation of the voltage impulse and detection of the reflected voltage impulse is measured. Finally, the length of the connection line is calculated by way of a predetermined propagation speed of electric voltage on the connection line and the measured transit time.

Advantageously, the composition of the connection line can thus be determined without having to electrically short-circuit earth contact and pilot contact beforehand.

According to another advantageous further development of the method, the composition of the connection line is determined at least by the electrical capacitance value of the connection line. Here, the capacitance value of the connection line is measured. The composition of the connection line can also be very accurately determined in this manner.

In a preferred further development of the circuit arrangement of in a further advantageous further development of the method, the frequency filter device includes a high-pass filter and/or a bandpass filter. Thus, the circuit arrangement can be trimmed even better for adhering to the standard IEC61851.

According to a further preferred further development of the circuit arrangement, the frequency filter device can be configured or is configured, in particular can be parametrized or is parametrized analogously or/and digitally. In a corresponding further advantageous further development of the method, the frequency filter device is configured, in particular parametrized analogously or/and digitally. This allows configuring the frequency filter device in a manner that can be technically realised particularly easily.

According to a further advantageous further development of the circuit arrangement or of the method, the frequency filter device includes exactly one electrical resistance and exactly one electrical capacitance, wherein the capacitance is electrically connected parallel to the resistance. Such a frequency filter device proves to be particularly robust.

In summary, the invention relates to an electronic circuit arrangement for an electric charging station having an electrical pilot contact and having an electrical earth contact, to which an electric motor vehicle for forming the electrical communication connection can be electrically connected and having an electrical line path, in which an electrical oscillator for generating a pulse width modulated electrical communication signal is arranged, wherein the oscillator subdivides the electrical line path into a pilot portion ending in the pilot contact and into an earth portion ending in the earth contact, wherein in the pilot portion of the electrical line path a frequency filter device is arranged.

Further important features and advantages of the invention are obtained from the subclaims, from the drawings and from the associated figure description by way of the drawings.

It is to be understood that the features mentioned above and still to be explained in the following cannot only be used in the respective combination stated but also in other combinations or by themselves without leaving the scope of the present invention.

Preferred exemplary embodiments of the invention are shown in the drawings and are explained in more detail in the following description, wherein same reference numbers relate to same or similar or functionally same components.

BRIEF DESCRIPTION OF THE DRAWINGS

It shows, in each case schematically

DETAILED DESCRIPTION

Figure 1:
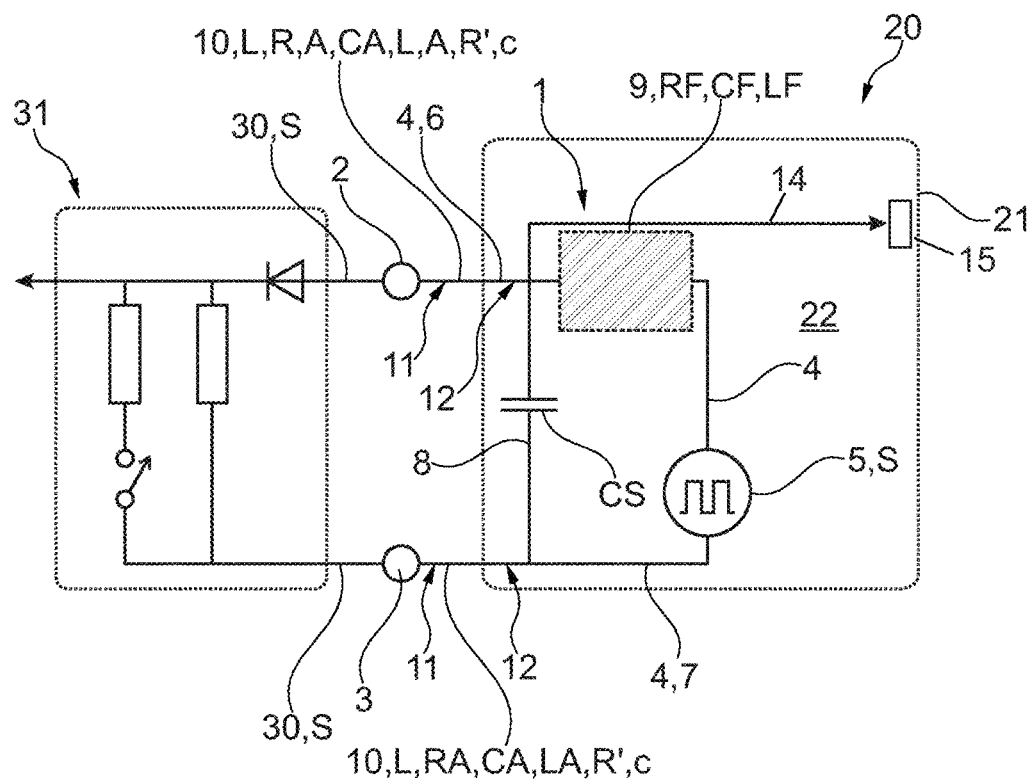
FIG. 1 in a circuit diagram-like representation, an example of an electronic circuit arrangement for an electric charging station according to the invention, FIG. 2 a further example of the electronic charging station according to the invention in a circuit diagram-like representation.

In FIG. 1, an example of an electronic circuit arrangement 1 for an electric charging station 20 according to the invention is shown in the manner of a circuit diagram. By means of the circuit arrangement 1, an electrical communication connection 30 between the electric charging station 20—which in the example of FIG. 1 includes the circuit arrangement 1 according to the invention—and an electric motor vehicle that can be recharged with electric energy by means of the charging station 20 can be formed. The electronic circuit arrangement 1 includes an electrical pilot contact 2 and an electrical earth contact 3, to which the electric motor vehicle 31 for forming the electrical communication connection 30 can be electrically connected. In addition, the electronic circuit arrangement 1 comprises an electrical line path 4, in which an electrical oscillator 5 for generating a pulse width modulated electrical communication signal S is arranged. Thus, the oscillator 5 can be a pulse width modulator functioning as signal source. The communication signal S generated by means of the oscillator 5 can be transmitted via the communication connection 30 from the charging station 20 to the electric motor vehicle 31. The motor vehicle 31 can also send an electrical signal to the charging station via the communication connection 30 if required.

FIG. 1 shows further that the oscillator 5 subdivides the electrical line path 4 at least into a pilot portion 6 and into an earth portion 7 of the electrical line path 4, the earth portion 7 can be electrically earthed. Here, the pilot portion 6 of the electrical line path 4 ends in the pilot contact 2 facing away from the oscillator 5. The earth portion 7 of the electrical line path 4 ends in the earth contact 3 facing away from the oscillator 5. In addition to this, the electronic circuit arrangement 1 includes an electrical parallel line path 8, in which an electrical capacitance CS is arranged. The electrical parallel line path 8, forming an electrical parallel circuit of the electrical capacitance CS to the oscillator 5, is electrically connected at an end to the pilot portion 6 and at the other end to the earth portion 7 of the electrical line path 4.

According to FIG. 1, a frequency filter device 9 for filtering the electrical communication signal K is arranged in the pilot portion 6 of the electrical line path 4. This frequency filter device 9 can be parametrizable, so that by configuring or parametrizing the frequency filter device 9 it is possible to adjust the frequencies of the electric voltage that can be attenuated and to what degree by the frequency filter device 9. In the pilot portion 6, an electrical voltage measuring device 15 is additionally connected to the electrical line path 4—between pilot contact 2 and frequency filter device 9—by means of which an electric voltage applied between pilot and earth contacts 2, 3 can be measured. This voltage measuring device 15 is shown in the FIG. 1; an arrow line pointing to the right illustrates schematically the routing of an electrical measuring line 14, by means of which the electrical voltage to be measured can be fed to the voltage measuring device 15.

Figure 2:
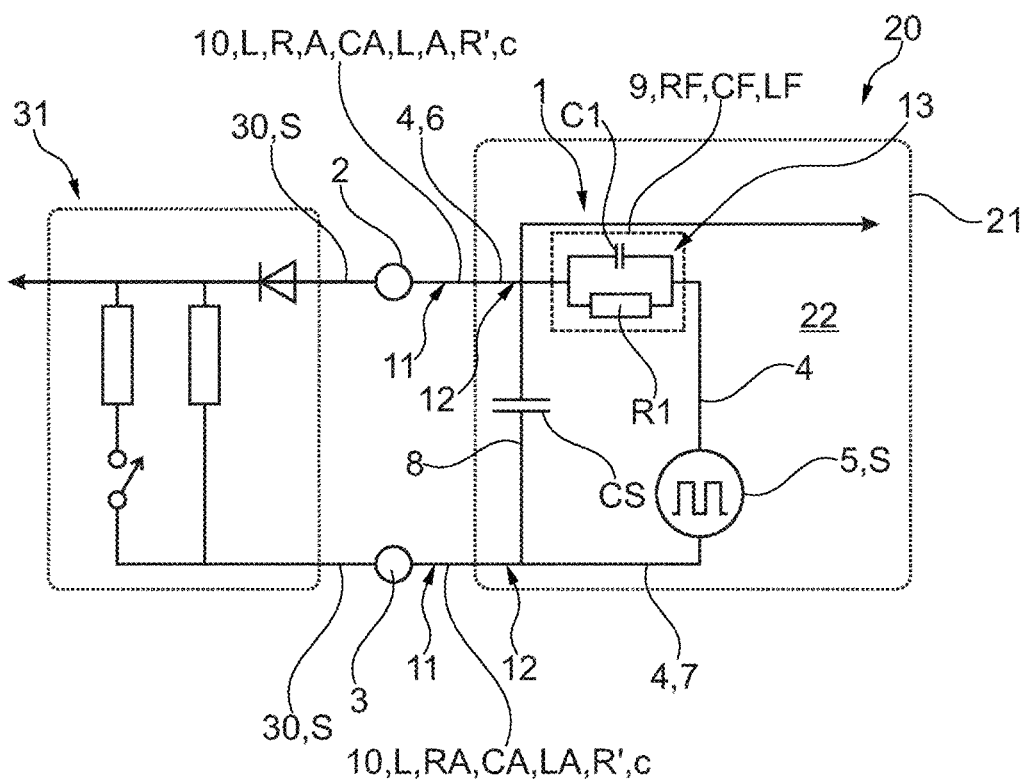

FIG. 2 likewise shows in a circuit diagram-like representation a further example of the electronic circuit arrangement 1 according to the invention, which differs from that of FIG. 1 exclusively in the specific configuration of the frequency filter device 9. Whereas the frequency filter device 9 in the FIG. 1 is abstracted into the black box, FIG. 2 indicates an exemplary embodiment of the electronic circuit arrangement 1 with a frequency filter device 9, which includes a high pass filter 13. According to FIG. 2, the frequency filter device 9 or its high pass filter 13 includes exactly one electrical resistance R1 and exactly one electrical capacitance Cl, wherein the capacitance Cl is electrically connected in parallel with the electrical resistance R1.

The frequency filter device 9 of the example of FIG. 1 can—alternatively to the example of FIG. 2—include a bandpass filter. However, the frequency filter device 9 can also comprise a combination of high pass filter 13 and bandpass filter, wherein high pass filter and bandpass filter then obviously act together in the manner of a bandpass filter. The frequency filter device 9 can be configured, in particular parametrized for example analogously and—alternatively or additionally—digitally.

The frequency filter devices 9 of the electronic circuit arrangements 1 exemplarily shown in the FIGS. 1 and 2 are configured by means of a method according to the invention. According to this method, the frequency device 9 is parametrized as a function of the composition of an electrical connection line 10 defining the pilot portion 6 and the earth portion 7 of the electrical line path 4 at least in portions. The composition of the connection line 10 can be an electrical impedance of the electrical connection line 14. The composition of the connection line 10 is or will be defined by at least one selection from a length L of the electrical connection line 10, an electrical resistance value RA of the electrical connection line 10, an electrical capacitance value CA of the connection line 10 and an electrical inductance value LA of the connection line 10. Here, the composition of the connection line 10 is determined according to the method. The connection line 10 defines the pilot portion 6 and the earth portion 7 of the electrical line path 4 in a region 11 that is present outside a housing interior space 2 and 20 delimited by a housing 21 of the electric charging station 20. Here, the frequency filter device 9, the oscillator 5, the capacitance CS and a remaining region 12 of the electrical line path 4 located away from the connection line 10 are arranged in the housing interior 22.

The frequency filter device 9 has an electrical filter resistance value RF and an electrical filter capacitance value CF and an electrical inductance value LF. The filter resistance value RF, the filter capacitance value CF and the inductance value LF are each parametrizable at equal to or greater than zero. Thus, the filter resistance value RF can be parametrized as equal to or greater than 0 ohm. The filter capacitance value CF can be parametrized as equal to or greater than 0 Farad. The filter inductance value LF can be parametrized as equal to or greater than 0 Henry. For example, the frequency filter device is parametrized by way of a value table. In this value table, incremental composition values are assigned to incremental parameter values. For example composition values for at least one selection from the length L of the electrical connection line 10, the electrical resistance value RA of the connection line 10, the electrical capacitance value CA of the electrical connection line 10 and the electrical inductance value of the connection line 10 for example are stored in the value table. For example incremental parameter values for the electrical filter resistance value RF and the electrical filter capacitance value CF and the electrical filter inductance value LF are stored in the value table.

In a first and a second version of the method, the pilot and the earth contacts 2, 3 are electrically short-circuited while determining the composition of the connection line 10.

According to the first version of the method, an electrical measuring resistance with predetermined measuring resistance value is electrically connected in series with the pilot portion 2 of the electrical line path 4. Then, a constant electrical voltage of a predetermined voltage value that is constant over the time is generated by means of an electric voltage source and, at a common end of the connection line 10 facing away from the pilot contact 2 and from the earth contact 3, applied to the pilot portion 6 and to the earth portion 7. Here, a voltage value of the electric voltage dropping across the measuring resistance is measured. In this version, the composition of the connection line 10 is determined at least by the electrical resistance value RA of the connection line 10, wherein the electrical resistance value RA of the connection line 10 is calculated from the voltage values of the predetermined constant electric voltage and the measured electric voltage dropping across the measuring resistance.

The calculation of the electrical resistance value RA of the connection line 10 in the first version of the method can be calculated by means of the following formula A:

$$RA = \frac{R_{known} * U_{line}}{U_{constant} - U_{line}}, \quad \text{(Formula A)}$$

wherein $R_{known}$ is the electrical measuring resistance value, $U_{constant}$ is the electrical voltage value of the constant electric voltage generated by means of the voltage source and $U_{line}$ is the difference between $U_{constant}$ and the voltage value of the voltage dropping across the measuring resistance.

According to the second version of the method, a constant electric current of a predetermined amperage that is constant over the time is generated by means of an electric current source and, at the common end of the connection line 10 facing away from the pilot contact 2 and from the earth contact 3, applied to the pilot portion 6 and the earth portion 7. Here, a voltage value of the electric voltage dropping across the pilot portion 6 and the earth portion 7 is measured. In this version, the composition of the connection line 10 is determined at least by the electrical resistance value RA of the connection line 10, wherein the electrical resistance value RA of the connection line 10 is calculated from the predetermined amperage and the measured voltage value of the electrical voltage dropping across the pilot portion 6 and the mass portion 7.

The calculation of the electrical resistance value RA of the connection line 10 in the second version of the method can be calculated by means of the following Formula B:

$$RA = \frac{U_{line}}{I_{constant}}, \quad \text{(Formula B)}$$

wherein $U_{line}$ is the electrical voltage value of the electrical voltage dropping across the pilot portion and the earth portion and $I_{constant}$ is the electrical amperage of the constant electric current generated by means of the electric current source.

Both with the first and also with the second version of the method, the composition of the connection line 10 can be additionally determined at least by the length L of the connection line 10. Here, the length L of the connection line 10 can be calculated from a predetermined electrical resistance lining R' of the connection line 10 and the calculated electrical resistance value RA of the connection line 10.

The calculation of the length L of the connection line RA with the first and the second version of the method can be carried out by means of the following Formula B:

$$L = \frac{RA}{R'}. \quad \text{(Formula C)}$$

Prior to this, the resistance lining R' of the connection line 10 can be predetermined by way of measurements or by way of a datasheet or from relevant table books for the method. Here, a prior measurement of the resistance lining R' on a sample of the connection line 10 of known line length can prove advantageous since transition resistances are directly taking into account in the measurement result.

In a third version of the method, the composition of the connection line 10 is determined at least by the length L of the connection line 10. Here, an electrical voltage impulse is generated by means of an electric voltage source and, emanating from an end of the connection line 10 facing away from the pilot contact 2 is sent through the region 11 of the pilot portion 6 existing in the connection line 10, wherein the pilot contact is exposed. The voltage impulse is reflected on the pilot contact 2. The reflected voltage impulse is detected at the end of the connection line 10 facing away from the pilot contact 2. Here, a transit time between generating the voltage impulse and detecting the reflected voltage impulse is measured. By way of a predetermined propagation speed c of electric voltage on the connection line 10 and the measured transit time, the length L of the connection line 10 is then calculated.

According to a fourth version of the method, the composition of the connection line 10 is determined at least by the electrical capacitance value CA of the connection line 10. Here, the capacitance value CA of the connection line 10 is measured.

With all versions of the method, the frequency filter device 9 can be configured, for example parametrized analogously and—alternatively or additionally—digitally.

The invention claimed is:

1. An electronic circuit arrangement for an electric charging station, the electronic circuit arrangement providing an electrical communication connection between the electric charging station and an electric motor vehicle that is rechargeable with electric energy via the charging station, the electronic circuit arrangement comprising:
    an electrical pilot contact and an electrical earth contact, to which the electric motor vehicle is electrically connectable for forming the electrical communication connection,
    an electrical line path and an electrical oscillator arranged in the electrical line path for generating a pulse width modulated electrical communication signal,
    wherein the electrical oscillator subdivides the electrical line path at least in a pilot portion ending in the pilot contact facing away from the electrical oscillator and into an earth portion ending in the earth contact facing away from the electrical oscillator,
    an electrical parallel line path, in which an electrical capacitance is arranged, is electrically connected to the pilot portion and the earth portion parallel to the electrical oscillator,
    an electrical parametrizable frequency filter device arranged in the pilot portion of the electrical line path for filtering the electrical communication signal, and
    wherein in the pilot portion an electrical voltage measuring device is electrically connected to the electrical line path between the pilot contact and the parametrizable frequency filter device, the electrical voltage measuring device configured to measure an electrical voltage applied between the pilot contact and the earth contact.

2. The electrical circuit arrangement according to claim 1, wherein the parametrizable frequency filter device is parametrized at least one of analogously and digitally.

3. The electrical circuit arrangement according to claim 1, wherein the parametrizable frequency filter device includes at least one of a high pass filter and a bandpass filter.

4. The electrical circuit arrangement according to claim 1, wherein the parametrizable frequency filter device includes one electrical resistance and one electrical capacitance, wherein the one electrical capacitance is electrically connected in parallel with the one electrical resistance.

5. A method for configuring an electrical frequency filter device of an electronic circuit arrangement that provides an electrical communication connection between an electric charging station and an electric motor vehicle, comprising:
    providing an electrical pilot contact, an electrical earth contact, an electrical line path and an electrical oscillator arranged in the electrical line path for generating a pulse width modulated electrical communication signal, wherein the electrical oscillator subdivides the electrical line path in a pilot portion ending in the pilot contact facing away from the electrical oscillator and into an earth portion ending in the earth contact facing away from the electrical oscillator, wherein an electrical parallel line path, in which an electrical capacitance is arranged, is electrically connected to the pilot portion and the earth portion parallel to the electrical oscillator, wherein the electrical frequency filter device is arranged in the pilot portion, and wherein in the pilot portion an electrical voltage measuring device is electrically connected to the electrical line path between the pilot contact and the frequency filter device for measuring an electrical voltage applied between the pilot contact and the earth contact;
    parametrizing the frequency filter device as a function of a composition of an electrical connection line defining the pilot portion and the earth portion of the electrical line path at least in portions; and
    determining the composition of the connection line at least by a selection from a length of the electrical connection line, an electrical resistance value of the electrical connection line, an electrical capacitance value of the electrical connection line, and an electrical inductance value of the electrical connection line.

6. The method according to claim 5, wherein the composition of the electrical connection line is determined according to the method.

7. The method according to claim 5, wherein:
    the electrical connection line determines the pilot portion and the earth portion of the electrical line path in a region that is present outside a housing interior delimited by a housing of the electric charging station, and
    in the housing interior the frequency filter device, the electrical oscillator, the electrical capacitance and a remaining region of the electrical line path located away from the electrical connection line are arranged.

8. The method according to claim 5, wherein:
    the frequency filter device comprises an electrical filter resistance value and an electrical filter capacitance value and an electrical filter inductance value that are each parametrized as equal to or greater than zero, and
    the frequency filter device is parametrized according to a value table, in which incremental composition values for at least one selection from the length of the electrical connection line, the electrical resistance value of the connection line, the electrical capacitance value of the connection line and the electrical inductance value of the connection line are assigned to incremental parameter values for the electrical filter resistance value and the electrical filter capacitance value and the electrical filter inductance value.

9. The method according to claim 5, wherein the pilot contact and the earth contact are electrically short-circuited when determining the composition of the connection line.

10. The method according to claim 9, wherein:
an electrical measuring resistance with a predetermined measuring resistance value is electrically connected in series with the pilot portion of the electrical line path,
further including generating via an electric voltage source a constant electrical voltage of a predetermined voltage value and, at a common end of the connection line facing away from the pilot contact and from the earth contact, applying the constant electrical voltage of the predetermined voltage value to the pilot portion and the earth portion,
measuring a voltage value of the electrical voltage dropping across the measuring resistance, and
wherein the composition of the connection line is determined at least by the electrical resistance value of the connection line, which is calculated from the voltage values of the predetermined constant electrical voltage and the measured electrical voltage dropping across the measuring resistance.

11. The method according to claim 9, further comprising:
generating via an electrical voltage source a constant electric current of a predetermined amperage and, at a common end of the connection line facing away from the pilot contact and from the earth contact, the constant electric current of the predetermined amperage is applied to the pilot portion and the earth portion,
measuring a voltage value of the electrical voltage dropping across the pilot portion and the earth portion, and
wherein the composition of the connection line is determined at least by the electrical resistance value of the connection line, which is calculated from the predetermined amperage and the measured voltage value of the electrical voltage dropping across the pilot portion and the earth portion.

12. The method according to claim 11, wherein:
the composition of the connection line is additionally determined at least by the length of the connection line, and
the length of the connection line is calculated from a predetermined electrical resistance lining of the connection line and the calculated electrical resistance value of the connection line.

13. The method according to claim 5, wherein:
the composition of the connection line is defined at least by the length of the connection line,
further including generating an electrical voltage impulse via an electrical voltage impulse source and, emanating from an end of the connection line facing away from the pilot contact, sending the electrical voltage impulse through a region of the pilot portion present in the connection line, wherein the pilot contact is exposed,
reflecting the electrical voltage impulse on the pilot contact,
detecting the reflected voltage impulse at an end of the connection line facing away from the pilot contact,
measuring a transit time between generating the voltage impulse and detecting the reflected voltage impulse, and calculating the length of the connection line via a predetermined propagation speed of electrical voltage on the connection line and the measured transit time.

14. The method according to claim 5, wherein:
the composition of the connection line is determined at least by the electrical capacitance value of the connection line,
the electrical capacitance value of the connection line is measured.

15. The method according to claim 5, wherein the frequency filter device includes at least one of a high pass filter and a bandpass filter.

16. The method according to claim 5, wherein the frequency filter device is parametrized at least one of analogously and digitally.

17. The method according to claim 5, wherein the frequency filter device includes exactly one electrical resistance and exactly one electrical capacitance, wherein the one electrical capacitance is electrically connected in parallel with the one electrical resistance.

18. The method according to claim 5, wherein the frequency filter device is parametrized as a function of an electrical impedance of the electrical connection line.

19. The method according to claim 10, wherein:
the composition of the electrical connection line is additionally determined at least by the length of the electrical connection line; and
the length of the electrical connection line is calculated from a predetermined electrical resistance lining of the electrical connection line and the calculated electrical resistance value of the electrical connection line.

20. An electronic circuit arrangement for an electric charging station, the electronic circuit arrangement providing an electrical communication connection between the electric charging station and an electric motor vehicle that is rechargeable with electric energy via the charging station, the electronic circuit arrangement comprising:
an electrical pilot contact and an electrical earth contact, to which the electric motor vehicle is electrically connectable for forming the electrical communication connection,
an electrical line path and an electrical oscillator arranged in the electrical line path for generating a pulse width modulated electrical communication signal,
wherein the electrical oscillator subdivides the electrical line path at least in a pilot portion ending in the pilot contact facing away from the electrical oscillator and into an earth portion ending in the earth contact facing away from the electrical oscillator,
an electrical parallel line path, in which an electrical capacitance is arranged, is electrically connected to the pilot portion and the earth portion parallel to the electrical oscillator,
an electrical frequency filter device arranged in the pilot portion of the electrical line path for filtering the electrical communication signal,
wherein in the pilot portion an electrical voltage measuring device is electrically connected to the electrical line path between the pilot contact and the frequency filter device, the electrical voltage measuring device configured to measure an electrical voltage applied between the pilot contact and the earth contact, and
wherein the frequency filter device includes at least one of a high pass filter and a bandpass filter.

* * * * *